United States Patent [19]

Landis

[11] Patent Number: 4,717,988

[45] Date of Patent: Jan. 5, 1988

[54] UNIVERSAL WAFER SCALE ASSEMBLY

[75] Inventor: Richard C. Landis, Shelton, Conn.

[73] Assignee: ITT Defense Communications Division of ITT Corporation, Nutley, N.J.

[21] Appl. No.: 860,151

[22] Filed: May 5, 1986

[51] Int. Cl.4 .............................................. H05K 1/18
[52] U.S. Cl. .................................... 361/403; 361/406; 361/416
[58] Field of Search ............... 361/416, 406, 404, 409, 361/403

[56] References Cited

U.S. PATENT DOCUMENTS

| 3,353,263 | 11/1967 | Helms | 361/416 X |
| 3,474,297 | 10/1969 | Bylander | 361/416 X |
| 3,525,617 | 8/1970 | Bingham | 361/416 X |
| 3,777,221 | 12/1973 | Tatusko et al. | 361/416 X |
| 3,818,279 | 6/1974 | Seeger et al. | 361/416 X |
| 4,458,297 | 7/1984 | Stopper | 174/68.5 X |
| 4,467,400 | 8/1984 | Stopper | 174/68.5 X |
| 4,613,924 | 9/1986 | Brault | 174/68.5 X |
| 4,617,471 | 10/1986 | Suzuki et al. | 361/406 X |

Primary Examiner—R. R. Kucia
Attorney, Agent, or Firm—Robert A. Walsh; Mary C. Werner

[57] ABSTRACT

A universal wafer scale assembly substrate includes an orthogonal multilayer matrix of conductive paths that, inter alia, define a plurality of chip sites. The paths defining the chip sites are provided with termination pads at the ends thereof proximate the site.

9 Claims, 4 Drawing Figures

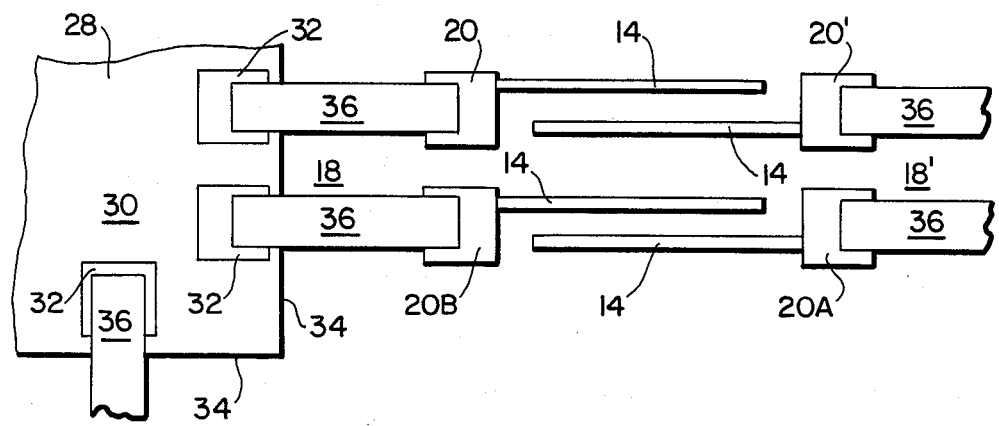
FIG. 2
FIG. 3
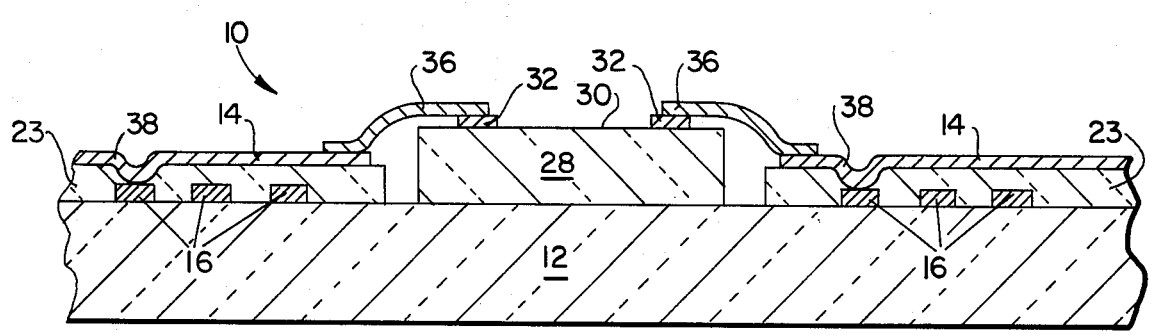

UNIVERSAL WAFER SCALE ASSEMBLY

CROSS-REFERENCE TO RELATED APPLICATIONS

This application is related to one, or more, of the following U.S. Patent Applications: Ser. No. 859,964, entitled PACKAGE FOR A SEMICONDUCTOR ASSEMBLY; Ser. No. 860,168, entitled HEADER FOR A WAFER SCALE ASSEMBLY; Ser. No. 859,942, entitled MULTILAYER CONNECTION FOR A SEMICONDUCTOR CHIP; Ser. No. 859,962, entitled JUMPER FOR A SEMICONDUCTOR ASSEMBLY; Ser. No. 859,961, entitled SEMICONDUCTOR INTEGRATED DEVICE HAVING REDUNDANT TERMINALS FOR DISCRETE ELECTRICAL CONDUCTORS; Ser. No. 859,940, entitled A DIRECT INTERCONNECTION FOR USE BETWEEN A SEMICONDUCTOR AND A PIN CONNECTION OR THE LIKE; Ser. No. 859,063, entitled MULTIPLE WAFER SCALE ASSEMBLY APPARATUS AND FIXTURE FOR USE DURING THE FABRICATION THEREOF and Ser. No. 859,938, entitled INTERLAY CONDUCTIVE CONNECTIONS AND METHOD FOR FORMING SAME all filed on even date herewith and assigned to the assignee hereof.

BACKGROUND OF THE INVENTION

The present invention generally relates to a substrate for a semiconductor assembly and, in particular, relates to one such substrate including means for establishing interconnections between and among a plurality of individual semiconductor chips.

In order to accomplish very high density multifunction semiconductor devices, the semiconductor industry has taken divergent approaches. One approach is generally referred to as the fully integrated device. In a fully integrated device all of the active devices are formed within the semiconductor substrate using known integration techniques. In addition to the devices, all of the interconnects are routed, layed out and also formed within the semiconductor wafer. Although this approach has had a reasonable rate of success, the success rate rapidly decreases when the density of devices exceeds certain limits. Under such conditions not only does normal semiconductor integration defects result in totally non-functional devices, but the actual design and layout of the devices and the interconnections therefor create unusual heat dissipation difficulties and interelectrode effects.

The other approach taken by the semiconductor industry is generally referred to as a wafer scale assembly. In such an assembly a substrate, usually a semiconductor wafer, is provided with a plurality of interconnections predesigned and layed out to accomodate a plurality of active chips that are bonded or otherwise attached to the substrate. In such an assembly the active devices can be pretested and, frequently, if found defective subsequent to assembly, can be replaced. One of the drawbacks of such assemblies is that, at least to date, the interconnections formed in the substrate have been formed and routed according to the conventional semiconductor integration fabrication techniques. That is, if two points separated on the substrate are to be connected, a metallization path is formed therebetween. In addition, when other points are to be interconnected, metallization paths interconnecting those points must either be disposed to avoid interfering with any previously layed out paths or they must be provided by a multilayer technique so that they are electrically isolated from every other electrical path. Consequently, each semiconductor substrate for a particular wafer scale assembly is personalized to that particular assembly and each different wafer scale assembly requires a different semiconductor wafer layout or pattern of metallization path. Such a diversity of semiconductor substrates, although providing the beneficial effect of wafer scale semiconductor assemblies, nevertheless, requires a considerable amount of design time to avoid interferences between various paths within the substrate. Such design time extensions significantly increase the cost of each new wafer scale assembly developed.

Consequently, there is a considerable need for the provision of a uniform, or universal, wafer scale assembly substrate that not only allows a reduced expense during the development and manufacturing of an assembly, but additionally provides the ability to interconnect any two points thereon in an efficient inexpensive fashion.

SUMMARY OF THE INVENTION

Accordingly, it is one object of the present invention to provide a universal wafer scale assembly substrate that can be used to implement a plurality of wafer scale assembly designs.

This object is accomplished, at least in part, by providing a semiconductor substrate having a matrix of floating electrically conductive paths therein and a plurality of chip sites available for the inclusion of functional active seimconductor chips thereon.

Other objects and advantages of the present invention will become apparent to those skilled in the art from the following detailed description read in conjunction with the appended claims and the drawings attached hereto.

BRIEF DESCRIPTION OF THE DRAWINGS

FIG. 2 is an enlarged view, not drawn to scale, of a portion of the substrate shown in FIG. 1 including an exemplary interconnected active chip;

FIG. 3 is a cross-sectional view, not drawn to scale, of a typical substrate embodying the principles of the present invention.

DETAILED DESCRIPTION OF THE INVENTION

Figure 1:
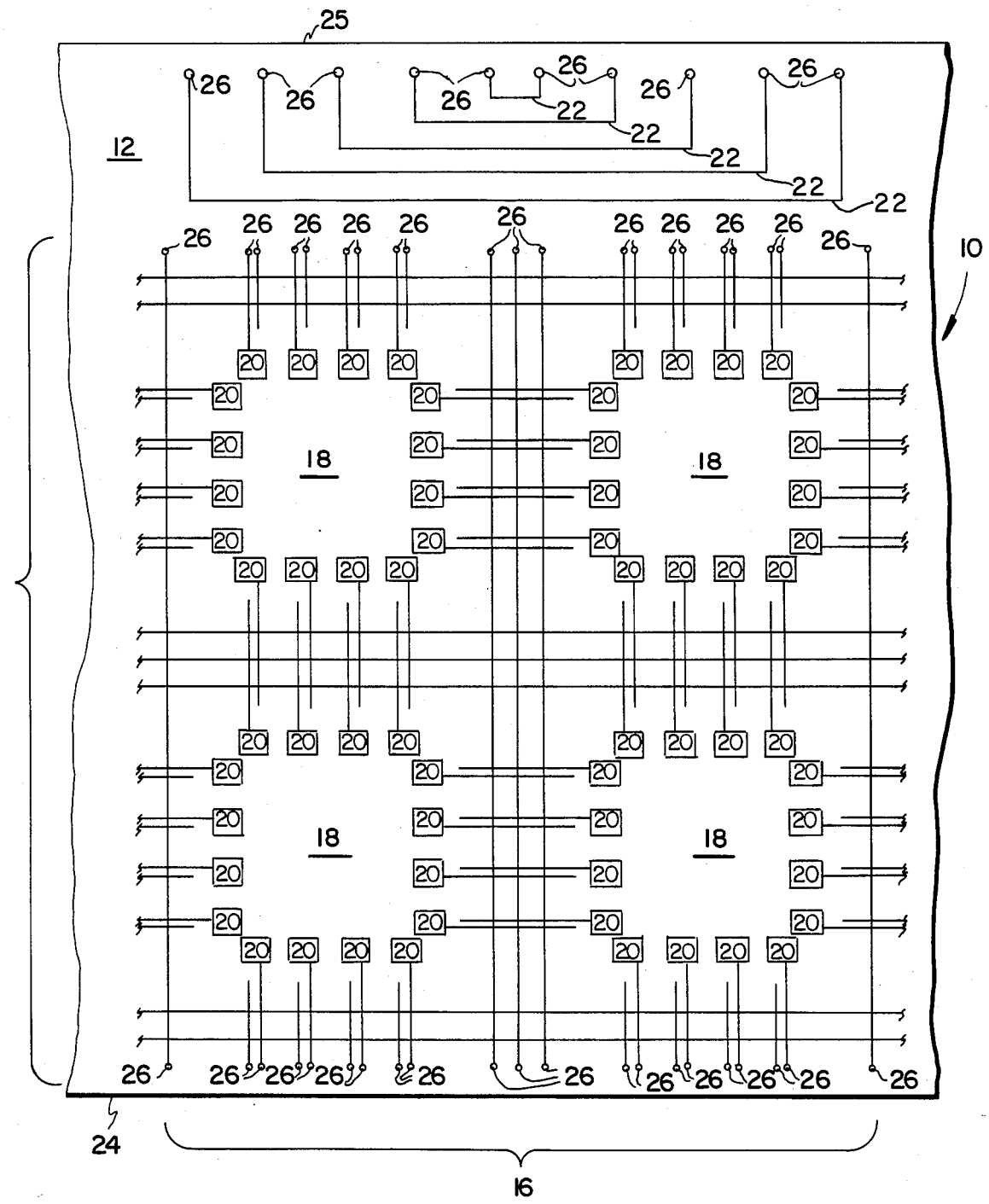
FIG. 1 is a plan view, not drawn to scale, of a semiconductor wafer scale assembly substrate embodying the principles of the present invention.

A wafer scale assembly substrate, generally indicated at 10 in FIG. 1 and embodying the principles of the present invention, includes a semiconductor substrate 12 having a matrix associated therewith, the matrix being defined by first and second pluralities of floating electrically conductive paths, 14 and 16, respectively, and including a plurality of chip sites 18, each chip site 18 being defined by a plurality of conductive path termination pads 20. Preferably, the substrate 10 further includes a plurality of electrically conductive paths 22 particularly adapted for establishing external connection to the substrate 10.

In one preferred embodiment, the semiconductor substrate 12 is a semiconductor wafer on the order of about 8 centimeters by 10 centimeters.

The first and second pluralities of conductive paths, 14 and 16, defining the matrix are preferably orthogonal to each other. Further, in the preferred embodiment, the paths, 14 and 16, are formed using high density techniques for metallization lines and, preferably, are formed in a multilayer fashion. In one embodiment, for example, the first plurality of conductive paths 14 are all oriented in a first direction and overlie the second plurality of conductive paths 16 orthogonal thereto. Typically, to avoid shorting between the first and second pluralities of paths, 14 and 16, respectively, a layer, indicated at 23 in FIG. 3, of dielectric material, such as, for example, silicon dioxide, is provided therebetween. In the preferred embodiment, each conductive path, 14 and 16, extending to an edge 24 of the substrate 12 terminates at a bonding pad 26. Such an arrangement allows the substrate 12 to be interconnected directly to an external device or connector via the bonding pads 26. One particular direct interconnect is described and discussed in U.S. Pat. Application Ser. No. 859,940 entitled A DIRECT INTERCONNECTION FOR USE BETWEEN A SEMICONDUCTOR AND A PIN CONNECTION OR THE LIKE. This application being filed on even date herewith and assigned to the assignee hereof is incorporated therein by reference.

Each chip site 18 is defined by the plurality of termination pads 20 disposed, in this embodiment, in a generally rectilinear outline. The pads 20 defining a chip site 18 are arranged in a shape that is slightly larger than the typical semiconductor chip, indicated at 28 in the Figures, to be mounted at that site 18. As more fully discussed hereinafter, such an arrangement allows for the interconnection between the active chip 28 and the termination pads 20 by use of conventional bonding techniques.

In one embodiment, the termination pads 20 associated with the chip sites 18 are closely spaced and correspond to the conventional disposition of bonding pads of the semiconductor chips 28. Further, each pad 20 conforms with bumped solder bonding techniques similar to that used for tape automated bonding. In one preferred embodiment, each termination pad 18 is a terminus for one of the orthogonal conductive paths, 14 or 16, although not all of the paths, 14 or 16, in the matrix are connected to a termination pad 20 of a chip site 18. The paths, 14 and 16, of the matrix, as more fully discussed hereinafter, unassociated with any chip site 18 are available for interconnecting different chips 28 or interconnecting a chip site 18 to one of the bonding pads 20 proximate an edge 24 of the substrate 12.

The plurality of electrically conductive paths 22 are, in this embodiment, disposed proximate one edge 25 and include a plurality of spaced apart pairs of interconnected bonding pads 26. The disposition of the paths 22 is particularly advantageous when the substrate 12 is to be interconnected in a back-to-back structure with another similar substrate. This advantage is readily apparent when it is recognized that when two similar substrates 12 are placed back-to-back, the left hand portion of one is opposite the right hand portion of the other. Hence, the paths 22 allow for the use of a jumper, not shown in the Figures, directly across the mated portions, thus avoiding the need for angularly disposed jumpers over the edges 25 of the back-to-back substrates. One such back-to-back structure is more fully described and discussed in U.S. Patent Application Ser. No. 859,963 entitled MULTIPLE WAFER SCALE ASSEMBLY APPARATUS AND FIXTURE FOR USE DURING THE FABRICATION THEREOF. A jumper that is particularly useful with such an assembly is more fully described and discussed in U.S. Patent Application Ser. No. 859,962 entitled JUMPER FOR A SEMICONDUCTOR ASSEMBLY. Both of these applications being filed on even date herewith and assigned to the assignee hereof. These applications are incorporated herein by reference.

A typical arrangement of paths, 14 or 16, that extend between adjacent chip sites 18, is shown in more detail in FIG. 2. For the convenience of the reader. elements previously described herein are indicated by the same indicia previously used to identify that element. As shown therein, a first set of termination pads, 20 and 20A, associated with a first chip site 18 are colinearly aligned with and spaced apart from a second set of termination pads, 20' and 20A', respectively, associated with a second chip site 18' adjacent the first chip site 18. As shown, the conductive paths 14 extending between corresponding ones of the pads 20 of the adjacent chip sites, 18 and 18', are, preferably, interdigitated. A typical active chip 28 includes termination pads 32 proximate the edges 34 thereof. Each termination pad 32 is appropriately interconnected to one of the termination pads, 20, 20A, of the substrate 12 by, for example, a discrete electrical conductor 36. One particular discrete electrical conductor 36 useful in such an arrangement is described and discussed in U.S. Patent Application Ser. No. 859,961 entitled SEMICONDUCTOR INTEGRATED DEVICE HAVING REDUNDANT TERMINALS FOR DISCRETE ELECTRICAL CONDUCTORS filed on even date herewith. This application is assigned to the assignee hereof and deemed incorporated herein by reference.

In one particular embodiment, the termination pads 20 are typically about 100 micrometers square whereas each of the conductive paths, 14 and 16, defining the orthogonal matrix is about 20 micrometers wide and spaced on 40 micrometer centers. Consequently, in such an arrangement no fan out is needed between the opposing proximate termination pads, 20 and 20', and 20A and 20A', of adjacent chip sites, 18 and 18', respectively, with respect to the orthogonal matrix. Such path and termination pad sizes are well within the range of conventional semiconductor fabrication techniques. Nevertheless, it is desirable that the termination pads 20 defining a chip site 18 be positioned such that the discrete electrical conductors 36 between a termination pad 32 on the active chip 18 and the termination pad 20 on the substrate 12 allows for the use of conventional bonding tools. Typically, such a lateral distance will be on the order of about 500 micrometers.

As needed, each pad 32 on the surface 30 of the chip 28 can be interconnected to the matrix by use of an interlayer conductive connector 38. One such interconnection is shown in the cross-section of FIG. 3. As before, each element previously discussed is designated by the previously used indicia. As shown therein, the active chip 18 is affixed to the substrate 12 and secured to respective termination pads 20 by use of, for example, discrete electrical conductors 36. The conductors 36, and hence, the actual active chip 28, are interconnected to the matrix by the interlayer conductive connection 38 that extends through the layer 23 of dielectric material. One typical interlayer conductive connection 38 particularly adapted for use with the present substrate 12 is more fully described and discussed in U.S. Patent Application Ser. No. 859,938 entitled INTERLAYER CONDUCTIVE CONNECTIONS AND METHOD FOR FORMING SAME and filed on even date herewith. This application is deemed incorporated herein by reference.

Figure 4:
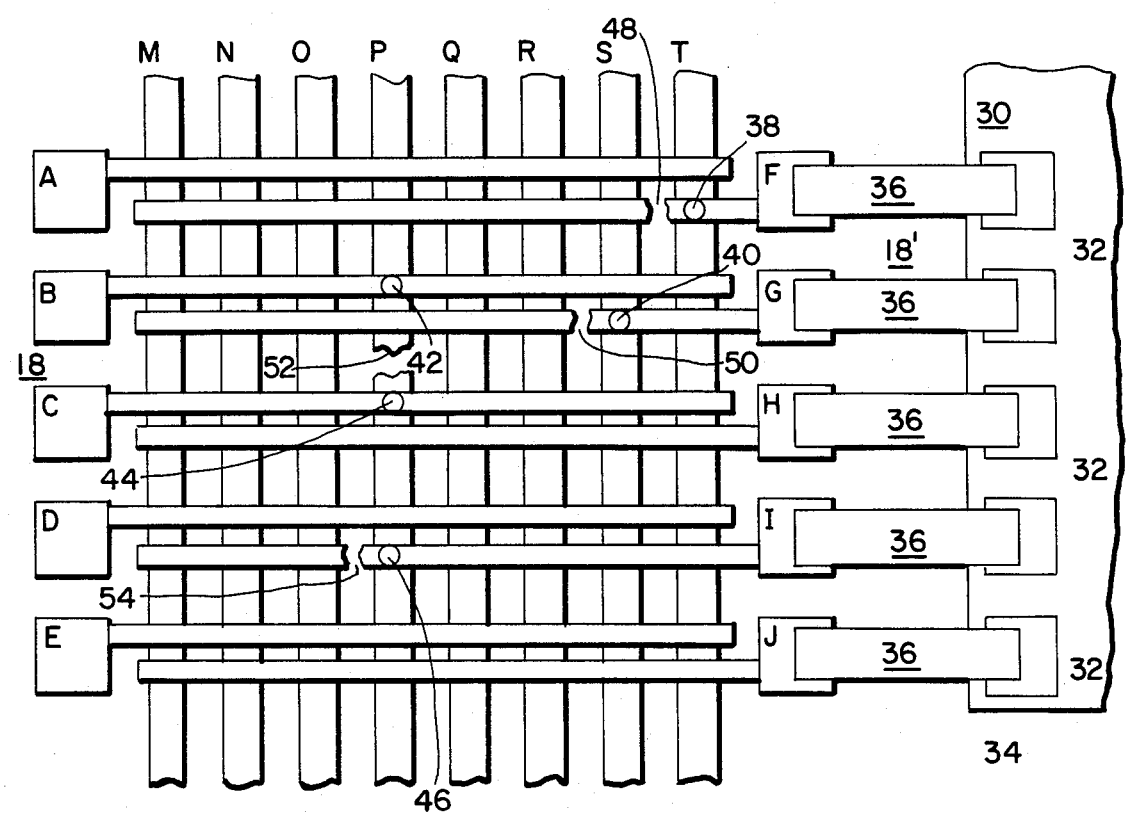
FIG. 4 is a partial plan view, not drawn to scale, of a substrate embodying the principles of the present invention and including exemplary interconnections.

The universal applicability of the substrate 12 is shown more clearly in the partial plan view of FIG. 4. Therein, a plurality of interlayer conductive connections, 38, 40, 42, 44 and 46, are formed in conjunction with a plurality of path openings, 48, 50, 52 and 54, at selected locations along the conductive paths, 14 and 16, of the matrix to interconnect virtually any termination pad of a given active device to any point on the substrate. The path openings, 48, 50, 52 and 54, can be formed by well known techniques, such as, for example, laser scribing.

In FIG. 4, two sets of termination pads, A–E and F–J, associated with adjacent chip sites, 18 and 18', are shown having interdigitated conductive paths therebetween. The substrate 12 also includes a plurality of orthogonal lines, M–T, that, in this embodiment, underlie the interdigitated lines A–E and F–J. A typical semiconductor chip 28 is shown associated with one of the chip sites 18'. The termination pad F is directly connected to line T via the interlayer conductive connection 38 and the path opening 48 whereas termination pad G is connected to line S by the interlayer conductive connection 40 and the path opening 50. The orthogonal underlying line P, in this embodiment, serves to interconnect with termination pad B via the interlayer conductive connection 42. Subsequent to forming the path opening 52 the line P is utilized to interconnect the termination pad C to termination pad I via the interlayer conductive connections 44 and 46. The terminal pad I can then be provided with path opening 54 to limit the further interconnections thereof. Naturally, many different interconnection paths can be fabricated in this manner.

The substrate 10 is particularly adaptable and advantageous for use with very large integrated circuits that may include on the order of 50,000 to 100,000 gates or 3 to 4 times that number of individual transistors. Thus, the substrate 10 allows a full custom design to be implemented and tested prior to the subsequent completed custom chip design being implemented. In addition, the substrate 10, by use of interconnects and laser scribing, can be formatted to any particular interconnection arrangement desired and, in fact, can be implemented by the direct use of a design tape from a computer aided design tool. Such a substrate 10 is also advantageous for providing a relatively rapid "breadboard" implementation of a hardware design as well as implementing repairable designs.

Although the present invention has been described with respect to particular embodiments, other arrangements and configurations may also be developed that, nevertheless, do not depart from the spirit and scope of the present invention. Hence, the present invention is deemed limited only by the appended claims and the reasonable interpretation thereof.

What is claimed is:

1. A semiconductor wafer scale assembly substrate comprising:

a matrix of electrically conductive paths;
   means for defining a plurality of chip sites, each said defined site being adapted to receive a chip and including a first plurality of termination pads, each said termination pad being conductively connected to one of said electrically conductive paths, said conductive paths between adjacent defined chip sites being interdigitated whereby each said chip received can be interconnected to said matrix; and
   a plurality of discrete electrical connections, each said connection being connected, on one end thereof, to one of said first plurality of termination pads.

2. Substrate as claimed in claim 13 wherein said matrix includes:
   a first plurality of floating electrically conductive paths; and
   a second plurality of floating electrically conductive paths.

3. Substrate as claimed in claim 2 wherein said first and second pluralities of floating electrically conductive paths are orthogonal to each other.

4. Substrate as claimed in claim 2 further comprises:
   a layer of dielectric material, said layer being disposed between said first and second pluralities of floating electrically conductive paths whereby said first plurality of paths is electrically isolated from said second plurality of paths.

5. Substrate as claimed in claim 1 further comprises:
   a second plurality of termination pads, said second plurality of termination pads being disposed proximate an edge of said substrate, each said second plurality of termination pads being a terminus of one of said electrically conductive paths.

6. Substrate as claimed in claim 5 further comprises:
   a third plurality of floating electrically conductive paths, said third plurality of floating electrically conductive paths being disposed proximate another edge of said substrate.

7. Substrate as claimed in claim 6 further comprises:
   a third plurality of termination pads, said third plurality of termination pads being disposed proximate said another edge of said substrate wherein ones of said third plurality of electrically conductive paths electrically interconnect pairs of spaced apart ones of said third plurality of termination pads.

8. Substrate as claimed in claim wherein said matrix includes:
   a first plurality of electrically conductive paths;
   a layer of dielectric material, said layer of dielectric material overlying said first plurality of conductive paths;
   a second plurality of electrically conductive paths; said second plurality of electrically conductive paths overlying and spaced apart from said first plurality of conductive paths by said layer of dielectric material; and
   means for electrically interconnecting one of said first plurality of electrically conductive paths and one of said second plurality of electrically conductive paths.

9. Substrate as claimed in claim 8 wherein said electrical interconnection means extends through said layer of dielectric material.

* * * * *